United States Patent
Ferrier (12)

(10) Patent No.: US 6,383,272 B1
(45) Date of Patent: May 7, 2002

(54) PROCESS FOR IMPROVING THE ADHESION OF POLYMERIC MATERIALS TO METAL SURFACES

(76) Inventor: Donald Ferrier, 455 Prospect St., Thomaston, CT (US) 06787

(*) Notice: Subject to any disclaimer, the term of this patent is extended or adjusted under 35 U.S.C. 154(b) by 55 days.

(21) Appl. No.: 09/590,046

(22) Filed: Jun. 8, 2000

(51) Int. Cl.$^7$ .................................................. B05D 3/00
(52) U.S. Cl. ........................ 106/14.42; 106/14.15; 106/14.17; 106/14.44; 106/287.2; 106/287.23; 427/96; 427/98; 427/327; 148/269; 148/272; 252/79.1; 252/79.2; 252/79.3; 252/79.4; 216/106; 216/107; 216/108; 216/109; 216/13
(58) Field of Search .......................... 427/96, 98, 327; 148/269, 272; 252/79.1, 79.2, 79.3, 79.4; 106/14.15, 14.17, 14.42, 14.44, 287.2, 287.23; 216/106, 108, 107, 109, 13

(56) References Cited

U.S. PATENT DOCUMENTS

| | | |
|---|---|---|
| 4,051,057 A | 9/1977 | Ericson et al. |
| 4,175,964 A | 11/1979 | Uchida et al. |
| 4,409,037 A | 10/1983 | Landau |
| 4,619,871 A | 10/1986 | Takami |
| 4,642,161 A | 2/1987 | Akahoshi et al. |
| 4,775,444 A | 10/1988 | Cordani |
| 4,844,981 A | 7/1989 | Landau |
| 4,902,551 A | 2/1990 | Nakaso et al. |
| 4,981,560 A | 1/1991 | Kojihara et al. |
| 4,997,516 A | 3/1991 | Adler |
| 4,997,722 A | 3/1991 | Adler |
| 5,128,065 A | 7/1992 | Hollander |
| 5,289,630 A | 3/1994 | Ferrier et al. |
| 5,366,814 A | 11/1994 | Yamanishi et al. |
| 5,550,006 A | 8/1996 | Larson et al. |
| 5,712,047 A | 1/1998 | Aso et al. |
| 5,800,859 A | 9/1998 | Price et al. |
| 5,869,130 A | 2/1999 | Ferrier |
| 6,020,029 A | 2/2000 | Ferrier et al. |
| 6,036,758 A | * 3/2000 | Fairweather ............ 106/14.44 |
| 6,146,701 A | * 11/2000 | Ferrier ........................ 427/327 |
| 6,162,503 A | * 12/2000 | Ferrier ........................ 427/327 |

FOREIGN PATENT DOCUMENTS

| | | |
|---|---|---|
| DE | 2557269 | 6/1977 |
| DE | 19732419 A1 | 2/1998 |
| EP | 0442197 A2 | 8/1991 |
| EP | 0670379 A1 | 2/1995 |
| EP | 0696651 A1 | 2/1996 |
| EP | 0757118 A1 | 2/1997 |
| EP | 0887439 A1 | 12/1998 |
| FR | 2134333 | 12/1972 |
| JP | 57116775 | 7/1982 |
| JP | 01240683 | 9/1989 |
| JP | 03079778 | 4/1991 |
| JP | 06057453 | 3/1994 |
| JP | 06192855 | 7/1994 |
| JP | 10056263 | 2/1998 |
| WO | WO94/16120 | 7/1994 |
| WO | WO 96/19097 | 6/1996 |

OTHER PUBLICATIONS

An Alternate Route to Red Oxide for Inner Layers, Allan G. Osborne, PC Fab, (Aug. 1984).

* cited by examiner

Primary Examiner—David Brunsman
(74) Attorney, Agent, or Firm—Carmody & Torrance LLP

(57) ABSTRACT

A composition and process are described which are useful in treating metal surfaces, which composition comprises an oxidizer, an acid, a corrosion inhibitor, an organic nitro compound and, optionally, a benzotriazole with an electron withdrawing group in the 1-position which electron withdrawing group is a stronger electron withdrawer than a hydrogen group, optionally, a source of adhesion enhancing species selected from the group consisting of molybdates, tungstates, tantalates, niobates, vanadates, isopoly or heteropoly acids of molybdenum, tungsten, tantalum, niobium, vanadium, and combinations of any of the foregoing and optionally but preferably a source of halide ions. The composition and process are useful in increasing the adhesion of metal surfaces to polymeric substances and in preserving said adhesion through temperature variation.

48 Claims, No Drawings

PROCESS FOR IMPROVING THE ADHESION OF POLYMERIC MATERIALS TO METAL SURFACES

BACKGROUND OF THE INVENTION

The present invention relates to printed circuits, and more particularly to a process for fabricating a multilayer printed circuit.

Printed circuits containing one or more circuitry innerlayers are in prominent use today as demand increases for further and further weight and space conservation in electronic devices.

In the typical fabrication of a multilayer printed circuit, patterned circuitry innerlayers are first prepared by a process in which a copper foil-clad dielectric substrate material is patterned with resist in the positive image of the desired circuitry pattern, followed by etching away of the exposed copper. Upon removal of the resist, there remains the desired copper circuitry pattern.

One or more circuitry innerlayers of any particular type or types of circuitry pattern, as well as circuitry innerlayers which might constitute ground planes and power planes, are assembled into a multilayer circuit by interposing one or more partially-cured dielectric substrate material layers (so-called "pre-preg" layers) between the circuitry innerlayers to form a composite of alternating circuitry innerlayers and dielectric substrate material. The composite is then subjected to heat and pressure to cure the partially-cured substrate material and achieve bonding of circuitry innerlayers thereto. The so-cured composite will then have a number of through-holes drilled therethrough, which are then metallized to provide a means for conductively interconnecting all circuitry layers. In the course of the through-hole metallizing process, desired circuitry patterns also typically will be formed on the outer-facing layers of the multilayer composite.

An alternate approach to the formation of a multilayer printed circuit board is through additive or surface laminar circuitry techniques. These techniques begin with a non-conductive substrate, upon which the circuit elements are additively plated. Further layers are achieved by repeatedly applying an imageable coating upon the circuitry and plating farther circuit elements upon the imageable coating.

It has long been known that the strength of the adhesive bond formed between the copper metal of the circuitry innerlayers and the cured pre-preg layers, or other non-conductive coatings, in contact therewith leaves something to be desired, with the result that the cured multilayer composite or the coating is susceptible to delamination in subsequent processing and/or use. In response to this problem, the art developed the technique of forming on the copper surfaces of the circuitry innerlayers (before assembling them with pre-preg layers into a multilayer composite) a layer of copper oxide, such as by chemical oxidation of the copper surfaces. The earliest efforts in this regard (so-called "black oxide" adhesion promoters) produced somewhat minimal improvement in the bonding of the circuitry innerlayers to the dielectric substrate layers in the final multilayer circuit, as compared to that obtained without copper oxide provision. Subsequent variations on the black oxide technique included methods wherein there is first produced a black oxide coating on the copper surface, followed by post-treatment of the black oxide deposit with 15% sulfuric acid to produce a "red oxide" to serve as the adhesion promoter, such as disclosed by A. G. Osborne, "An Alternate Route To Red Oxide For Inner Layers", PC Fab. August 1984, as well as variations involving direct formation of red oxide adhesion promoter, with varying degrees of success being obtained. The most notable improvement in this art is represented in the U.S. Pat. Nos. 4,409,037 and 4,844,981 to Landau, the teachings both of which are included herein by reference in their entirety, involving oxides formed from relatively high chlorite/relatively low caustic copper oxidizing compositions, and producing substantially improved results in circuitry innerlayer adhesion.

As earlier noted, the assembled and cured multilayer circuit composite is provided with through-holes which then require metallization in order to serve as a means for conductive interconnection of the circuitry layers of the circuit. The metallizing of the through-holes involves steps of resin desmearing of the hole surfaces, catalytic activation, electroless copper depositing, electrolytic copper depositing, and the like. Many of these process steps involve the use of media, such as acids, which are capable of dissolving the copper oxide adhesion promoter coating on the circuitry innerlayer portions exposed at or near the through hole. This localized dissolution of the copper oxide, which is evidenced by formation around the through-hole of a pink ring or halo (owing to the pink color of the underlying copper metal thereby exposed), can in turn lead to localized delamination in the multilayer circuit.

The art is well aware of this "pink ring" phenomenon, and has expended extensive effort in seeking to arrive at a multilayer printed circuit fabrication process which is not susceptible to such localized delamination. One suggested approach has been to provide the adhesion promoting copper oxide as a thick coating so as to retard its dissolution in subsequent processing simply by virtue of sheer volume of copper oxide present. This turns out to be essentially counter-productive, however, because the thicker oxide coating is inherently less effective as an adhesion promoter per se. Other suggestions relating to optimization of the pressing/curing conditions for assembling the multilayer composite have met with only limited success.

Other approaches to this problem involve post-treatment of the copper oxide adhesion promoter coating prior to assembly of circuitry innerlayers and pre-preg layers into a multilayer composite. For example, U.S. Pat. No. 4,775,444 to Cordani discloses a process in which the copper surfaces of the circuitry innerlayers are first provided with a copper oxide coating and then contacted with an aqueous chromic acid solution before the circuitry innerlayers are incorporated into the multilayer assembly. The treatment serves to stabilize and/or protect the copper oxide coating from dissolution in the acidic media encountered in subsequent processing steps (e.g. through-hole metallization), thereby minimizing pink ring/delamination possibilities.

U.S. Pat. No. 4,642,161 to Akahoshi et al, U.S. Pat. No. 4,902,551 to Nakaso et al, and U.S. Pat. No. 4,981,560 to Kajihara et al, and a number of references cited therein, relate to processes in which the copper surfaces of the circuitry innerlayers, prior to incorporation of the circuitry innerlayers into a multilayer circuit assembly, are first treated to provide a surface coating of adhesion-promoting copper oxide. The copper oxide so formed is then reduced to metallic copper using particular reducing agents and conditions. As a consequence, the multilayer assembly employing such circuitry innerlayers will not evidence pink ring formation since there is no copper oxide present for localized dissolution, and localized exposure of underlying copper, in subsequent through-hole processing. As with other techniques, however, processes of this type are suspect in terms of the adhesion attainable between the dielectric substrate layers and the metallic copper circuitry innerlayers. This is particularly so in these reduction processes since the circuitry bonding surface not only is metallic copper, but also presents the metallic copper in distinct phases (i.e., (1) copper-from-reduction-of-copper oxide over (2) copper of the copper foil) which are prone to separation/delamination along the phase boundary.

U.S. Pat. Nos. 4,997,722 and 4,997,516 to Adler similarly involve formation of a copper oxide coating on the copper surfaces of circuitry innerlayers, followed by treatment with a specialized reducing solution to reduce the copper oxide to metallic copper. Certain portions of the copper oxide apparently may not be reduced all the way to metallic copper (being reduced instead to hydrous cuprous oxide or cuprous hydroxide), and those species are thereafter dissolved away in a non-oxidizing acid which does not attack or dissolve the portions already reduced to metallic copper. As such, the multi-layer assembly employing such circuitry innerlayers will not evidence pink ring formation since there is no copper oxide present for localized dissolution, and localized exposure of underlying copper, in subsequent through-hole processing. Here again, however, problems can arise in terms of the adhesion between the dielectric layers and metallic copper circuitry innerlayers, firstly because the bonding surface is metallic copper, and secondly because the metallic copper predominately is present in distinct phases (i.e., (1) copper-from-reduction-of-copper oxide over (2) copper of the copper foil), a situation prone to separation/delamination along the phase boundary.

U.S. Pat. No. 5,289,630 to Ferrier et al., the teachings of which are incorporated herein by reference in their entirety, reveals a process whereby an adhesion promoting layer of copper oxide is formed on the circuit elements followed by a controlled dissolution and removal of a substantial amount of the copper oxide in a manner which does not adversely affect the topography.

PCT Application No. WO 96/19097 to McGrath (and related U.S. Pat. No. 5,800,859), the teachings of which are incorporated by reference herein in their entirety, discusses a process for improving the adhesion of polymeric materials to a metal surface. The process discussed involves contacting the metal surface with an adhesion-promoting composition comprising hydrogen peroxide, an inorganic acid, a corrosion-inhibitor and a quaternary ammonium surfactant.

This invention proposes a process for improving the adhesion of polymeric materials to a metal surface, especially copper or copper alloy surfaces. The process proposed herein is particularly useful in the production of multilayer printed circuits. The process proposed herein provides optimum adhesion between the metallic and polymeric surfaces (i.e. the circuitry and the intermediate insulating layer), eliminates or minimizes pink ring and operates economically, all as compared to conventional processes.

SUMMARY OF THE INVENTION

The inventors herein propose a process for improving the adhesion of polymeric materials to metal surfaces, particularly copper and copper alloy surfaces. The proposed process comprises:

1). Contacting the metal surface with an adhesion-promoting composition comprising:
  a) an oxidizer;
  b) an acid;
  c) a corrosion inhibitor;
  d) an organic nitro compound, preferably an aromatic nitro compound and most preferably an organic nitro compound selected from the group consisting of sodium meta-nitrobenzenesulfonate, para-nitrophenol, 3,5-dinitrosalicylic acid and 3,5-dinitrobenzoic acid.
  e) optionally, a benzotriazole with an electron withdrawing group in the 1 position which group is a stronger electron withdrawing group than a hydrogen group;
  f) optionally, a source of adhesion enhancing species, which species are selected from the group consisting of molybdates, tungstates, tantalates, niobates, vanadates, isopoly or heteropoly acids of molybdenum, tungsten, tantalum, niobium, vanadium, and combinations of any of the foregoing; and
  g) optionally, a source of halide ions.

2) thereafter bonding the polymeric material to the metal surface.

The inventors have found that the foregoing process improves the adhesion of metal surfaces to the polymeric materials, particularly when the metal surfaces comprise copper or copper alloys. The process proposed is particularly suited to the production of multilayer printed circuit boards.

DETAILED DESCRIPTION OF THE INVENTION

The inventor herein has found that the adhesion between a metal surface and a polymeric material is enhanced by contacting the metal surface with an adhesion-promoting composition prior to bonding the polymeric material to the metal surface. The invention therefore proposes a process for increasing the adhesion of a polymeric material to a metal surface, said process comprising:

1) contacting the metal surface with an adhesion-promoting composition comprising:
  a) an oxidizer;
  b) an acid;
  c) a corrosion inhibitor;
  d) an organic nitro compound, preferably an aromatic nitro compound, and most preferably an organic nitro compound selected from the group consisting of sodium meta-nitrobenzenesulfonate, para-nitrophenol, 3,5-dinitrosalicylic acid and 3,5-dinitrobenzoic acid.
  e) optionally, a benzotriazole with an electron withdrawing group in the 1-position which electron withdrawing group is a stronger electron withdrawer than a hydrogen group and which electron withdrawing group is preferably selected from the group consisting of hydroxy groups, amino groups, nitro groups, nitrile groups, sulfonate groups, carboxylate groups, halide groups, mercaptan groups, and unsaturated alkyl groups;
  f) optionally, adhesion enhancing species, which species are selected from the group consisting of molybdates, tungstates, tantalates, niobates, vanadates, isopoly or heteropoly acids of molybdenum, tungsten, tantalum, niobium, vanadium, and combinations of any of the foregoing;
  g) optionally, a water soluble polymer; and
  h) optionally, a source of halide ions.

2) thereafter bonding the polymeric material to the metal surface.

The inventors have found that the proposed adhesion-promoting composition produces a micro-roughened conversion-coated surface upon the metal. The surface produced is particularly suited to bonding with polymeric materials in that significantly increased adhesion values are achieved as compared to a non-treated metal surface. In addition the conversion coated (treated) metal surface maintains the increased adhesion over time and decreases the likelihood of any unwanted reactions occurring over time between the metal and the polymeric material.

The process proposed is particularly suited to the manufacture of multilayer printed circuit boards. Thus, in this application, the metal circuitry (usually copper) of the innerlayers is treated with the adhesion-promoting composition proposed herein. After treatment, followed by water rinsing, the innerlayers are bonded together with polymeric materials such as pre-pregs or imageable dielectrics, resulting in the multilayer printed circuit board.

The metal surface to be treated may comprise a variety of metals such as copper, copper alloys, nickel and iron. However, the process of the invention produces the best results when the metal surfaces comprise copper or copper alloys. The polymeric material may be a variety of polymeric materials including pre-preg materials, imageable dielectrics, photoimageable resins, soldermasks, adhesives or polymeric etch resists.

The oxidizer used in the adhesion-promoting composition may comprise any oxidizer which is capable of oxidizing the metal surface in the matrix of the adhesion-promoting composition. The inventors have found hydrogen peroxide and persulfates to be particularly preferred oxidizers for use in the process of the invention, with hydrogen peroxide being the most preferred oxidizer. The concentration of the oxidizer in the adhesion-promoting composition may range from 0.5 to 120 grams per liter but is preferably from 2 to 60 grams per liter and is most preferably from 3 to 30 grams per liter.

The acid utilized in the adhesion-promoting composition may be any acid which is stable in the matrix, however, the inventors have found mineral acids to be particularly preferred. Sulfuric acid is especially preferred. The concentration of the acid in the adhesion-promoting composition may range from 1 to 360 grams per liter but is preferably from 20 to 110 grams per liter.

The corrosion inhibitor used in the adhesion-promoting composition is a compound which effectively reacts with the metal surface to form a protective complex layer. Preferred corrosion inhibitors are selected from the group consisting of triazoles, benzotriazoles, tetrazoles, imidazoles, benzimidazoles and mixtures of the foregoing. Benzotriazoles a re particularly preferred. The concentration of the corrosion inhibitor in the adhesion-promoting composition may range from 0.1 to 50 grams per liter but is preferably from 0.2 to 5 grams per liter.

The inventors have found that the inclusion of organic nitro compounds, preferably aromatic nitro compounds, in the adhesion promoting composition yields a composition which will react with a metallic surface, particularly copper or copper alloys, to give a uniform conversion coated metallic surface which bonds well to polymeric materials, while etching the metal surface at relatively low rates. Low metal etch rates are advantageous for at least three reasons. First, a low etch rate removes less metal from the surface thereby leaving more of the original metal cross section in tact. The foregoing is particularly important for circuit traces with impedance or resistance tolerances which must be maintained since these properties are directly related to the cross sectional area of the circuit. Second, low metal etch rates allow the opportunity for reworking defective parts. Lastly, low metal etch rates reduce the rate at which metal builds up in the adhesion promoting composition. Since metal build up in the adhesion promoting composition has an effect upon the ultimate useable life of the composition, lower etch rates lead to an extended useable life for the adhesion promoting solutions in terms of the maximum square feet of metal processable per gallon of adhesion promoting composition. The organic nitro compounds useable in the adhesion promoting composition of this invention are preferably aromatic nitro compounds. Some examples of particularly useful organic nitro compounds are sodium meta-nitrobenzenesulfonate, para-nitrophenol, 3,5-dinitrosalicylic acid, and 3,5-dinitrobenzoic acid. The concentration of the organic nitro compound in the adhesion promoting composition may range from 0.05 to 25 grams per liter, but is preferably from 0.1 to 10 grams per liter and is most preferably from 0.2 to 2 grams per liter.

The inventors have also found that the addition of a benzotriazole with an electron withdrawing group in the 1-position, which electron withdrawing group is a stronger electron withdrawer than a hydrogen group, produces advantages with respect to the uniformity of the coating produced and the adhesion achieved after bonding. The inventors have found that the electron withdrawing group is preferably selected from the group consisting of hydroxy groups, amino groups, nitro groups, nitrile groups, sulfonate groups, carboxylate groups, halide groups, mercaptan groups and unsaturated allyl groups. Most preferably the electron withdrawing group is a hydroxy group and thus the most preferable material in this regard is 1-hydroxy benzotriazole with the following structure:

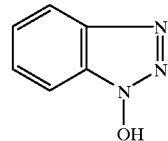

The corrosion inhibitor and the benzotriazole with an electron withdrawing group in the 1-position may both be the same compound. For instance, 1-hydroxybenzotriazole may fill the roles of both the corrosion inhibitor and the benzotriazole with the electron withdrawing group in the 1-position.

The advantages achievable with the use of the foregoing materials are most pronounced when a source of adhesion enhancing species, as described below, is used in conjunction with the foregoing materials in the adhesion-promoting composition. The inventors have found that the combination proposed produces synergistic effects. The concentration of the benzotriazole with the electron withdrawing group in the 1-position can range from 0.2 g/l to 20 g/l but is preferably from 0.5 g/l to 5 g/l.

The source of adhesion enhancing species can be any material, which will supply species selected from the group consisting of molybdates, tungstates, tantalates, niobates, vanadates and mixtures thereof to the adhesion promoting composition. Such sources include alkali metal salts of molybdates, tungstate, tantalates, niobates, vanadates and mixtures thereof such as sodium (or potassium) molybdate, tungstate, niobate or vanadate, and heteropoly acids or isopoly acids of molybdenum, tungsten, tantalum, niobium or vanadium. Thus, molybdates or tungstates which include heteroatoms such as phosphorous, silicon, cobalt, manganese and tungsten are suitable. Preferred sources include iso and hetero polyacids of molybdenum, tungsten, niobium, vanadium and mixtures thereof such as molybdic acid, vanadic acid and tungstic acid. The most preferred source of adhesion enhancing species is molybdic acid. The concentration of adhesion enhancing species in the adhesion promoting composition may range from 1 mg/l to 500 mg/l (based on the adhesion enhancing ion content) but is preferably from 5 mg/l to 200 mg/l. The adhesion-enhancing species may be utilized with or without the benzotriazole with the electron withdrawing group in the 1-position.

Optionally, the adhesion-promoting composition may also comprise a water soluble polymer. If used, the water soluble polymer is preferably not a wetter or surfactant but is instead a water soluble homopolymer or copolymer of low molecular weight water soluble monomers. Most preferably, the water soluble polymer is a polymer of ethylene oxide, an ethylene oxide-propylene oxide copolymer, polyethylene glycols, polypropylene glycols or polyvinyl alcohols. Among the most preferred are the polymers of ethylene oxide, or polyethylene glycols sold by the Union Carbide Company under the tradename Carbowax. The inventors have found Carbowax 750 and Carbowax MPEG 2000 to be particularly useful. Also particularly useful are the ethylene oxide polymers or ethylene oxide-propylene oxide copolymers sold by the BASF Company under the Pluronic tradename. The concentration of the water soluble polymer in the adhesion-promoting composition can range from 0.2 to 15 grams per liter, but is preferably from 3 to 6 grams per liter.

The adhesion promoting composition preferably contains a source of halide ions. The source of halide ions may be any compound which would provide halide ions in the matrix of the adhesion-promoting composition. Preferably, the source of halide ions are alkaline metal salts such as sodium chloride or potassium chloride, oxohalides such as sodium chlorate or potassium chlorate, or halide bearing mineral acids such as hydrochloric acid. Preferably the source of halide ions provides chloride ions to the adhesion-promoting composition. The concentration of the source of halide ions in the adhesion-promoting composition may range from 0.5 to 500 milligrams per liter but is preferably from 1 to 12 milligrams per liter, all based on halide ion content.

Thus, the adhesion-promoting composition should contain an acid, an oxidizer, a corrosion inhibitor and an organic nitro compound. Preferably the composition also comprises a benzotriazole with an electron withdrawing group in the 1-position as described herein or the corrosion inhibitor may be the benzotriazole with the electron withdrawing group in the 1-position. In either case, the composition preferably also comprises adhesion enhancing species as described herein, whether or not the benzotriazole with the electron withdrawing group in the 1-position is used or not. In addition, the adhesion promoting composition also preferably comprises a source of halide ions.

The metal surface can be treated with the adhesion-promoting composition in a variety of ways, including immersion, spray, or flood. The temperature of the adhesion-promoting composition during treatment may range from 80° F. to 150° F. but is preferably from 90° F. to 120° F. The treatment time will vary depending upon the temperature and method of treatment but may range from 15 seconds to 15 minutes and is preferably from 1 to 2 minutes.

The following examples are illustrative of the invention but should not be taken as limiting:

The following cycle was used in processing the copper clad panels and copper foils in all of the following examples:

|  | Time (Min) |
|---|---|
| 5% Sulfuric acid, 70° F. | 1 |
| Cold Water Rinse | 1 |
| Alkaline Soak Cleaner 150° F. | 2 |
| Cold Water Rinse | 2 |
| Predip (2 gr/l benzotriazole, 1% v/v 50% $H_2O_2$), 70° F. | 1 |
| Adhesion Promotion Solution, 100° F. | 1 |
| Cold Water Rinse | 1 |
| Forced Air Dry | 1 |

COMPARATIVE EXAMPLE

An adhesion promotion composition of the following composition was made up: 140 g/l copper sulfate pentahydrate, 0.2 g/l benzotriazole, 3 g/l 1-hydroxy benzotriazole, 9 mg/l sodium chloride, 2% by volume sulfuric acid and 1.5% by volume of 50% by weight hydrogen peroxide. Copper surfaces processed through this solution had a non-uniform dark pink appearance and exhibited a weight loss equivalent to a 35 microinch thickness of copper.

EXAMPLE 1–14

Solutions used in the following examples were made up in the same way as the Comparative Example, with levels of the following components adjusted to the levels indicated in Table I below, with the resulting appearance and etch rate on a copper surface as indicated in Table I below.

TABLE I

| Example | Sodium Chloride | Hydroxbenzo-triazole | Nitro Compound | Appearance | Each Rate |
|---|---|---|---|---|---|
| 1 | 12 mg/L | 3.0 g/L | MNBS, 1 g/L | Purple/pink | 30 uin |
| 2 | 9 mg/L | 3.0 g/L | PNP, 0.5 g/L | Purple/pink | 25 uin |
| 3 | 9 mg/L | 3.0 g/L | PNP, 1.0 g/L | Very dark brown | 25 uin |
| 4 | 12 mg/L | 3.5 g/L | PNP, 1.5 g/L | Purple/brown | 25 uin |
| 5 | 9 mg/L | 3.0 g/L | DNSA, 0.1 g/L | Purple/pink | 25 uin |
| 6 | 9 mg/L | 3.0 g/L | DNSA, 0.2 g/L | Dark brown | 25 uin |
| 7 | 12 mg/L | 3.0 g/L | DNSA, 0.3 g/L | Very dark brown | 25 uin |
| 8 | 15 mg/L | 3.0 g/L | DNSA, 0.3 g/L | Dark purple/pink | 25 uin |
| 9 | 15 mg/L | 3.5 g/L | DNSA, 0.3 g/L | Dark purple/brown | 20 uin |
| 10 | 9 mg/L | 3.0 g/L | DNBA, 0.3 g/L | Purple/pink | 20 uin |
| 11 | 9 mg/L | 3.0 g/L | DNBA, 0.6 g/L | Dark purple/pink | 20 uin |
| 12 | 9 mg/L | 3.0 g/L | DNBA, 1.0 g/L | Purple/brown | 20 uin |

TABLE I-continued

| Example | Sodium Chloride | Hydroxbenzo-triazole | Nitro Compound | Appearance | Each Rate |
|---|---|---|---|---|---|
| 13 | 12 mg/L | 3.0 g/L | MNBS, 1.5 g/L PNP, 0.5 g/L | Dark purple | 30 uin |
| 14 | 12 mg/L | 3.0 g/L | MNBS, 1.5 g/L PNP, 1.0 g/L | Very dark brown | 30 uin |

The abbreviations in the Table I represent the following components:
MNBS = Sodium meta-nitrobenzenesulfonate
PNP = para-nitrophenol
DNSA = 3,5-dinitrosalicylic acid
DNBA = 3,5-dintrobenzoci acid
UIN = microinchs The of each of the copper surfaces treated in Table I was uniform. After treatment the copper clad panels and foils were laminated together with NELCO 4205-2B stage material and etched to form one-inch strips. These strips were immersed in molten solder at 550° F. for zero, ten and twenty seconds. The strips were then peeled to determine the strength of the copper to polymer bond after lamination. The results obtained are reported in Table II.

TABLE II

| Example | 0 Seconds Solder | 10 Seconds Solder | 20 Seconds Solder |
|---|---|---|---|
| Comparative | 4.8 lb./in | 4.5 lb./in | 4.0 lb./in |
| 1 | 5.2 lb./in | 4.8 lb./in | 4.2 lb./in |
| 2 | 5.5 lb./in | 5.0 lb./in | 3.8 lb./in |
| 3 | 6.0 lb./in | 5.2 lb./in | 4.0 lb./in |
| 4 | 6.5 lb./in | 6.0 lb./in | 4.8 lb./in |
| 5 | 5.5 lb./in | 5.0 lb./in | 4.8 lb./in |
| 6 | 6.0 lb./in | 5.8 lb./in | 5.0 lb./in |
| 7 | 6.0 lb./in | 5.5 lb./in | 4.5 lb./in |
| 8 | 6.0 lb./in | 5.8 lb./in | 4.8 lb./in |
| 9 | 6.0 lb./in | 5.8 lb./in | 4.8 lb./in |
| 10 | 5.2 lb./in | 5.0 lb./in | 4.5 lb./in |
| 11 | 5.2 lb./in | 5.2 lb./in | 4.5 lb./in |
| 12 | 5.8 lb./in | 5.2 lb./in | 4.5 lb./in |
| 13 | 5.2 lb./in | 5.0 lb./in | 4.2 lb./in |
| 14 | 5.8 lb./in | 5.5 lb./in | 4.8 lb./in |

What is claimed is:

1. A composition useful in increasing the adhesion of a polymeric material to a metal surface, said composition comprising:
   a. an oxidizer;
   b. an acid;
   c. a corrosion inhibitor;
   d. an organic nitro compound; and
   e. a source of halide ions.

2. A composition according to claim 1 wherein the oxidizer is selected from the group consisting of hydrogen peroxide and persulfates.

3. A composition according to claim 1 wherein the corrosion inhibitor is selected from the group consisting of triazoles, benzotriazoles, imidazoles, tetrazoles and mixtures of the foregoing.

4. A composition according to claim 3 wherein the oxidizer is selected from the group consisting of hydrogen peroxide and persulfates.

5. A composition according to claim 3 wherein the adhesion-promoting composition comprises a benzotriazole with an electron withdrawing group in the 1-position which electron withdrawing group is a stronger electron withdrawer than a hydrogen group.

6. A composition according to claim 3 wherein the adhesion promoting composition also comprises a source of adhesion enhancing species, which species are selected from the group consisting of molybdates, tungstates, tantalates, niobates, vanadates, isopoly or heteropoly acids of molybdenum, tungsten, tantalum, niobium or vanadium and combinations of any of the foregoing.

7. A composition according to claim 3 wherein the organic nitro compound is selected from the group consisting of p-nitrophenol, 3,5-dinitro salicylic acid and 3,5-dinitrobenzoic acid.

8. A composition according to claim 1 wherein the adhesion-promoting composition also comprises a benzotriazole with an electron withdrawing group in the 1 position which electron withdrawing group is a stronger electron withdrawer than a hydrogen group.

9. A composition according to claim 8 wherein the benzotriazole is 1-hydroxy benzotriazole.

10. A composition according to claim 8 wherein the concentration of the benzotriazole is from 0.2 to 20 grams per liter.

11. A composition according to claim 1 wherein the adhesion-promoting composition also comprises a source of adhesion enhancing species, which species are selected from the group consisting of molybdates, tungstates, tantalates, niobates, vanadates, isopoly or heteropoly acids of molybdenum, tungsten, tantalum, niobium or vanadium, and combinations of any of the foregoing.

12. A composition according to claim 11 wherein the adhesion-enhancing species are selected from the group consisting of molybdates, tungstates, vanadates and combinations of the foregoing.

13. A composition according to claim 11 wherein the concentration of the adhesion enhancing species is from 1 to 500 milligrams per liter.

14. A composition according to claim 1 wherein the organic nitro compound is selected from the group consisting of p-nitro phenol, 3,5-dinitrosalicylic acid, and 3,5-dinitrobenzoic acid.

15. A composition according to claim 14 wherein the adhesion-promoting composition also comprises a benzotriazole with an electron withdrawing group in the 1-position, which electron withdrawing group is a stronger electron withdrawer than a hydrogen group.

16. A composition according to claim 14 wherein the adhesion promoting composition also comprises a source of adhesion enhancing species, which species are selected from the group consisting of molybdates, tungstates, tantalates, niobates, vanadates, isopoly or heteropoly acids of molybdenum, tungsten, tantalum, niobium or vanadium, and combinations of any of the foregoing.

17. A composition according to claim 1 wherein the adhesion-promoting composition also comprises a water soluble polymer.

18. A composition according to claim 1 wherein the concentration of the oxidizer is from 0.5 to 120 grams per liter, the concentration of the acid is from 1 to 360 grams per liter, the concentration of the corrosion inhibitor is from 0.1 to 50 grams per liter, the concentration of the halide ion is from 0.5 to 500 milligrams per liter and the concentration of the organic nitro compound is from 0.05 to 25 grams per liter.

19. A composition useful in increasing adhesion of a polymeric material to a metal surface, said composition comprising:
    a. an oxidizer;
    b. an acid;
    c. a corrosion inhibitor;
    d. an organic nitro compound; and
    e. a source of adhesion enhancing species, which species are selected from the group consisting of molybdates, tungstates, tantalates, niobates, vanadates, isopoly or heteropoly acids of molybdenum, tungsten, tantalum, niobium or vanadium, and combinations of any of the foregoing.

20. A composition according to claim 19 wherein the oxidizer is selected from the group consisting of hydrogen peroxide and persulfates.

21. A composition according to claim 19 wherein the corrosion inhibitor is selected from the group consisting of triazoles, benzotriazoles, imidazoles, tetrazoles, and mixtures of the foregoing.

22. A composition according to claim 21 wherein the oxidizer is selected from the group consisting of hydrogen peroxide and persulfates.

23. A composition according to claim 21 wherein the adhesion-promoting composition comprises a benzotriazole with an electron withdrawing group in the 1-position which electron withdrawing group is a stronger electron withdrawer than a hydrogen group.

24. A composition according to claim 21 wherein the organic nitro compound is selected from the group consisting of p-nitrophenol, 3,5-dinitro salicylic acid and 3,5-dinitrobenzoic acid.

25. A composition according to claim 24 wherein the adhesion-promoting composition also comprises a benzotriazole with an electron withdrawing group in the 1-position, which electron withdrawing group is a stronger electron withdrawer than a hydrogen group.

26. A composition according to claim 19 wherein the adhesion-promoting composition also comprises a benzotriazole with an electron withdrawing group in the 1 position which electron withdrawing group is a stronger electron withdrawer than a hydrogen group.

27. A composition according to claim 26 wherein the benzotriazole is 1-hydroxy benzotriazole.

28. A composition according to claim 26 wherein the concentration of the benzotriazole is from 0.2 to 20 grams per liter.

29. A composition according to claim 19 wherein the organic nitro compound is selected from the group consisting of p-nitro phenol, 3,5-dinitrosalicylic acid, and 3,5 dinitrobenzoic acid.

30. A composition according to claim 29 wherein the adhesion-enhancing species are selected from the group consisting of molybdates, tungstates, vanadates and combinations of the foregoing.

31. A composition according to claim 29 wherein the concentration of the adhesion enhancing species is from 1 to 500 milligrams per liter.

32. A composition according to claim 19 wherein the adhesion-promoting composition also comprises a water soluble polymer.

33. A composition according to claim 19 wherein the concentration of the oxidizer is from 0.5 to 120 grams per liter, the concentration of the acid is from 1 to 360 grams per liter, the concentration of the corrosion inhibitor is from 0.1 to 50 grams per liter and the concentration of the organic nitro compound is from 0.05 to 25 grams per liter.

34. A composition useful in increasing adhesion of a polymeric material to a metal surface, said composition comprising:
    a. an oxidizer;
    b. an acid;
    c. a corrosion inhibitor;
    d. an organic nitro compound; and
    e. a benzotriazole with an electron withdrawing group in the 1 position which electron withdrawing group is a stronger electron withdrawer than a hydrogen group.

35. A composition according to claim 34 wherein the oxidizer is selected from the group consisting of hydrogen peroxide and persulfates.

36. A composition according to claim 34 wherein the corrosion inhibitor is selected from the group consisting of triazoles, benzotriazoles, imidazoles, tetrazoles, and mixtures of the foregoing.

37. A composition according to claim 36 wherein the oxidizer is selected from the group consisting of hydrogen peroxide and persulfates.

38. A composition according to claim 36 wherein the adhesion promoting composition also comprises a source of adhesion enhancing species, which species are selected from the group consisting of molybdates, tungstates, tantalates, niobates, vanadates, isopoly or heteropoly acids of molybdenum, tungsten, tantalum, niobium or vanadium and combinations of any of the foregoing.

39. A composition according to claim 36 wherein the organic nitro compound is selected from the group consisting of p-nitrophenol, 3,5-dinitro salicylic acid and 3,5-dinitrobenzoic acid.

40. A composition according to claim 34 wherein the benzotriazole is 1-hydroxy benzotriazole.

41. A composition according to claim 40 wherein the concentration of the benzotriazole is from 0.2 to 20 grams per liter.

42. A composition according to claim 34 wherein the adhesion-promoting composition also comprises a source of adhesion enhancing species, which species are selected from the group consisting of molybdates, tungstates, tantalates, niobates, vanadates, isopoly or heteropoly acids of molybdenum, tungsten, tantalum, niobium, or vanadium, and combinations of any of the foregoing.

43. A composition according to claim 42 wherein the adhesion-enhancing species are selected from the group consisting of molybdates, tungstates, vanadates and combinations of the foregoing.

44. A composition according to claim 42 wherein the concentration of the adhesion enhancing species is from 1 to 500 milligrams per liter.

45. A composition according to claim 34 wherein the organic nitro compound is selected from the group consisting of p-nitrophenol, 3,5-dinitrosalicylic acid, and 3,5-dinitrobenzoic acid.

46. A composition according to claim 45 wherein the adhesion promoting composition also comprises a source of adhesion enhancing species, which species are selected from the group consisting of molybdates, tungstates, tantalates, niobates, vanadates, isopoly or heteropoly acids of molybdenum, tungsten, tantalum, niobium or vanadium, and combinations of any of the foregoing.

47. A composition according to claim 34 wherein the adhesion-promoting composition also comprises a water soluble polymer.

48. A composition according to claim 34 wherein the concentration of the oxidizer is from 0.5 to 120 grams per liter, the concentration of the acid is from 1 to 360 grams per liter, the concentration of the corrosion inhibitor is from 0.1 to 50 grams per liter, and the concentration of the organic nitro compound is from 0.05 to 25 grams per liter.

* * * * *